United States Patent
Tan

[19]

[11] Patent Number: 6,127,829
[45] Date of Patent: Oct. 3, 2000

[54] METHOD AND APPARATUS FOR THE EFFICIENT TEST OF THE CENTER FREQUENCY OF BANDPASS FILTERS

[75] Inventor: Mehmet Ali Tan, Irvine, Calif.

[73] Assignee: Texas Instruments Incorporated, Dallas, Tex.

[21] Appl. No.: 08/988,174

[22] Filed: Dec. 10, 1997

[51] Int. Cl.[7] .................................................. G01R 27/28
[52] U.S. Cl. ............................................ 324/619; 324/618
[58] Field of Search ........................ 369/44.13; 324/618, 324/619, 76.71; 333/178, 179, 180

[56] References Cited

U.S. PATENT DOCUMENTS 3,419,799  12/1968  Papadeas .................................. 324/619
4,467,271   8/1984  Ruckenbauer .......................... 324/619

FOREIGN PATENT DOCUMENTS 2545004  4/1977  Germany ................................ 324/619

*Primary Examiner*—Safet Metjahic
*Assistant Examiner*—Jose M. Solis
*Attorney, Agent, or Firm*—W. Daniel Swayze, Jr.; W. James Brady, III; Frederick J. Telecky, Jr.

[57] ABSTRACT

A method and apparatus for determining the center frequency of a bandpass filter. The center frequency of a bandpass filter is determined by applying a bias voltage to a bandpass filter circuit receiving a pair of differential input voltages and producing a pair of differential output voltages. The differential output voltages are modified to exhibit a notchband magnitude characteristic. A minimum value of the differential output voltages exhibiting the notchband characteristic over a predetermined range of frequencies is determined and corresponds to the center frequency of the bandpass filter.

14 Claims, 3 Drawing Sheets

METHOD AND APPARATUS FOR THE EFFICIENT TEST OF THE CENTER FREQUENCY OF BANDPASS FILTERS

CROSS REFERENCED APPLICATION INFORMATION

Application Ser. No. 08/988,158, now U.S. Pat. No. 6,011,770 entitled "Method and Apparatus for a High Order Bandpass Filter With Linearly Adjustable Bandwidth" and naming the same inventor, is hereby identified as having been filed on the same day herewith and as being jointly owned by the same assignee.

BACKGROUND OF THE INVENTION

1. Field of the Invention

The present invention relates to the field of bandpass filters, and more particularly, to bandpass filters used to capture a wobble signal utilized in the read head and write head circuits of optical disk apparatus.

2. Description of the Related Art

Bandpass filters are commonly used in Digital Versatile Disk (DVD-RAM) and Compact Disk (CD-RW) apparatus. Specifically, bandpass filters are used in the read channel and write circuits of these devices. In operation, the bandpass filter serves to capture the wobble signal used in the positional control of the read and write heads associated with the optical disk apparatus. The wobble signal is typically embedded in a group of sinusoidal signals transmitted to the heads of an optical disk apparatus, with the frequency of the signal typically being in the range of 80–200 Khz.

Capture, which is the selective passing of the wobble signal through the bandpass filter, is a function of the center frequency of the bandpass filter. The more accurate the determination of the center frequency of the bandpass filter, the greater the accuracy of the filter in passing only the frequency associated with the wobble signal without passing additional or extraneous signal frequencies unassociated with the wobble signal. Accordingly, it is desirable to have an efficient and accurate means to determine the center frequency of a bandpass filter in order to optimize the capture of a wobble signal.

Conventionally, measurement of the center frequency of a bandpass filter is accomplished by measuring the maximum of the magnitude characteristic of the filter in question. However, bandpass filters generally have relatively flat magnitude characteristics about the center frequency, which makes difficult accurate measurement or test of the center frequency within, for example, an accuracy of 1%, since there is such a small differential in the magnitude of the characteristic of a bandpass filter about the center frequency.

Conventional devices have been proposed such as those disclosed in Whitten (U.S. Pat. No. 3,643,173) and Cabot (U.S. Pat. No. 5,136,267). These conventional devices incorporate tuneable microelectronic bandpass filters to achieve an effective inductance—and, hence, tuning of the center frequency—over a band of frequencies. To the inventor's knowledge however, none of the prior art devices presents a method or apparatus for measuring the center frequency to the degree of accuracy afforded by the present invention.

SUMMARY OF THE INVENTION

The present invention is directed to a circuit for the measurement of the center frequency of a bandpass filter that overcomes the limitations associated with conventional methods of measurement of the center frequency of a bandpass filter.

Accordingly, it is an object of the present invention to provide for the accurate measurement of the center frequency of a bandpass filter of better than 1%.

Another object of the invention is to provide for the accurate search for the center frequency of a bandpass filter by effectively increasing the rate of change of the magnitude values around the center frequency of the bandpass filter, thereby allowing faster identification of the center frequency of the filter.

By way of summary, the present invention pertains to a test circuit coupled to a bandpass filter circuit in which the test circuit, in a first operating mode, does not affect the magnitude characteristic of the bandpass filter circuit. In a second operating mode, the test circuit causes the bandpass filter magnitude characteristic to change to that of a notch filter. In this manner, and because the magnitude characteristic of a notch filter is more sharply defined than that of a bandpass filter, the center frequency of the filter (which is the same for both bandpass and notch filter operations) can more easily be detected.

It is to be understood that both the foregoing general description and the following detailed description are merely exemplary and explanatory in nature and are intended to provide further explanation of the present invention as claimed.

BRIEF DESCRIPTION OF THE DRAWINGS

The accompanying drawings are included to provide a further understanding of the present invention and are incorporated in and constitute a part of this specification. The drawings illustrate a presently preferred embodiment of the invention and, together with the description, serve to explain the principles of the invention.

DETAILED DESCRIPTION OF THE PREFERRED EMBODIMENTS

Reference will now be made in detail to the present preferred embodiment of the invention, an example of which is illustrated in the accompanying drawings.

Figure 1:
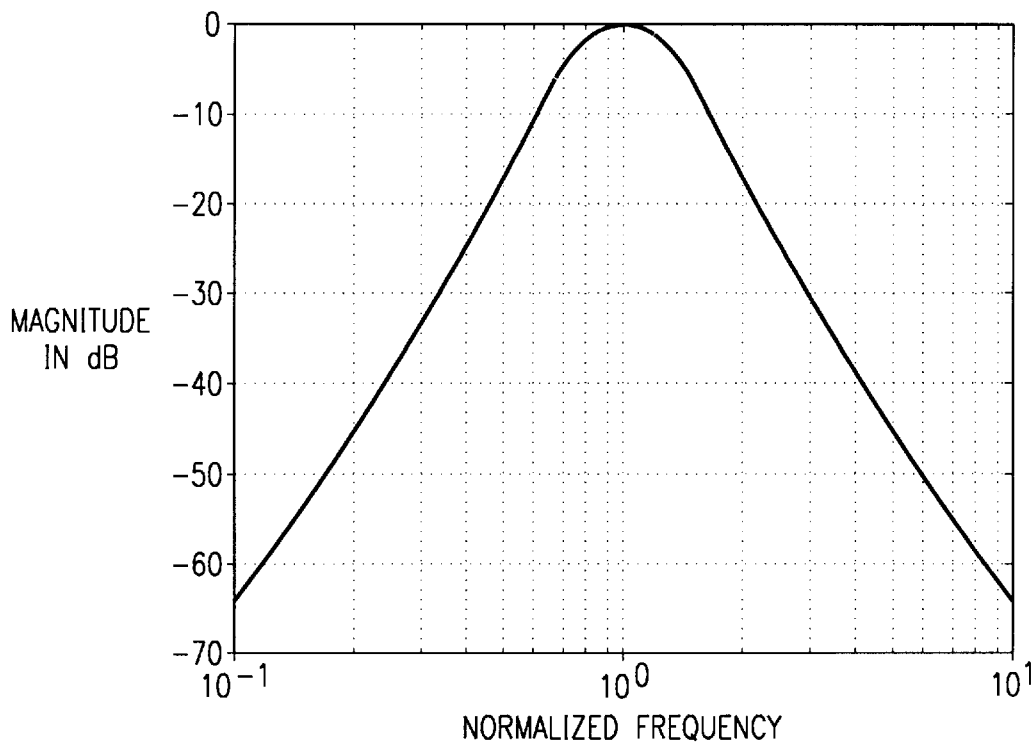
FIG. 1 represents the magnitude characteristic of a sixth order bandpass filter that may be used in a test circuit in accordance with the present invention.
Figure 2:
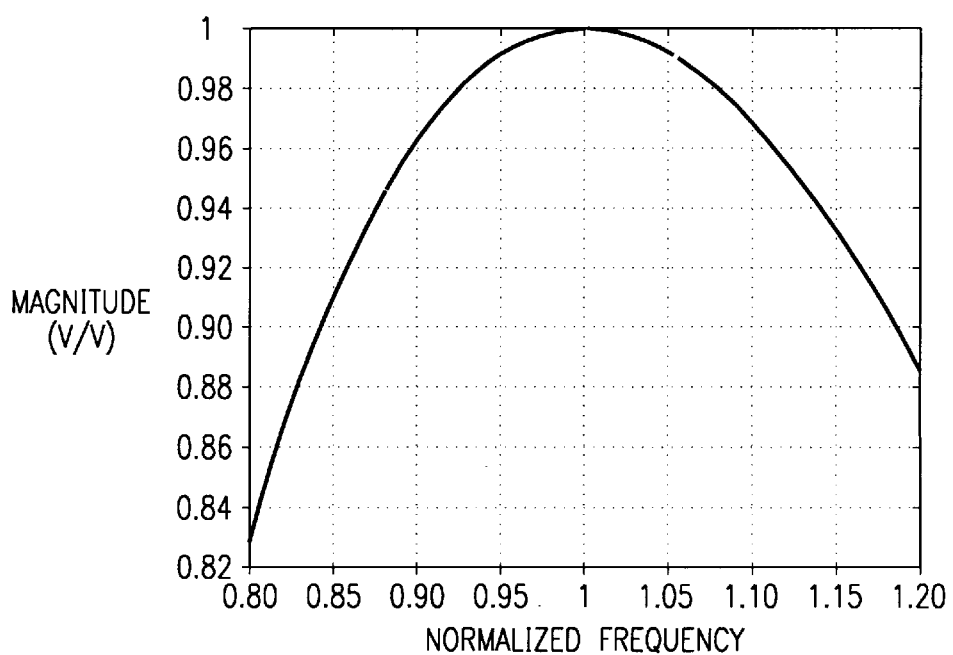
FIG. 2 illustrates a detailed magnitude characteristic of a bandpass filter that may be used in a test circuit in accordance with the present invention.

The magnitude characteristic of a typical bandpass filter for a range of frequencies is shown in FIG. 1. If the bandwidth of the filter is not very narrow, the rate of change of the magnitude characteristic is low. As a result, finding the maximum magnitude presents some difficulty. This condition is depicted by FIG. 2, which shows in greater detail the apex of the gain versus frequency characteristic of a filter and how moderate its rate of change may be across its center frequency. As shown therein, the magnitude changes are on the order of approximately 0.8% around the center frequency, which requires the capability to detect a variance of 8 mV in 1V in order to achieve the desired degree of accuracy of measurement. As a practical matter, these changes are difficult to detect under normal conditions.

Figure 3:
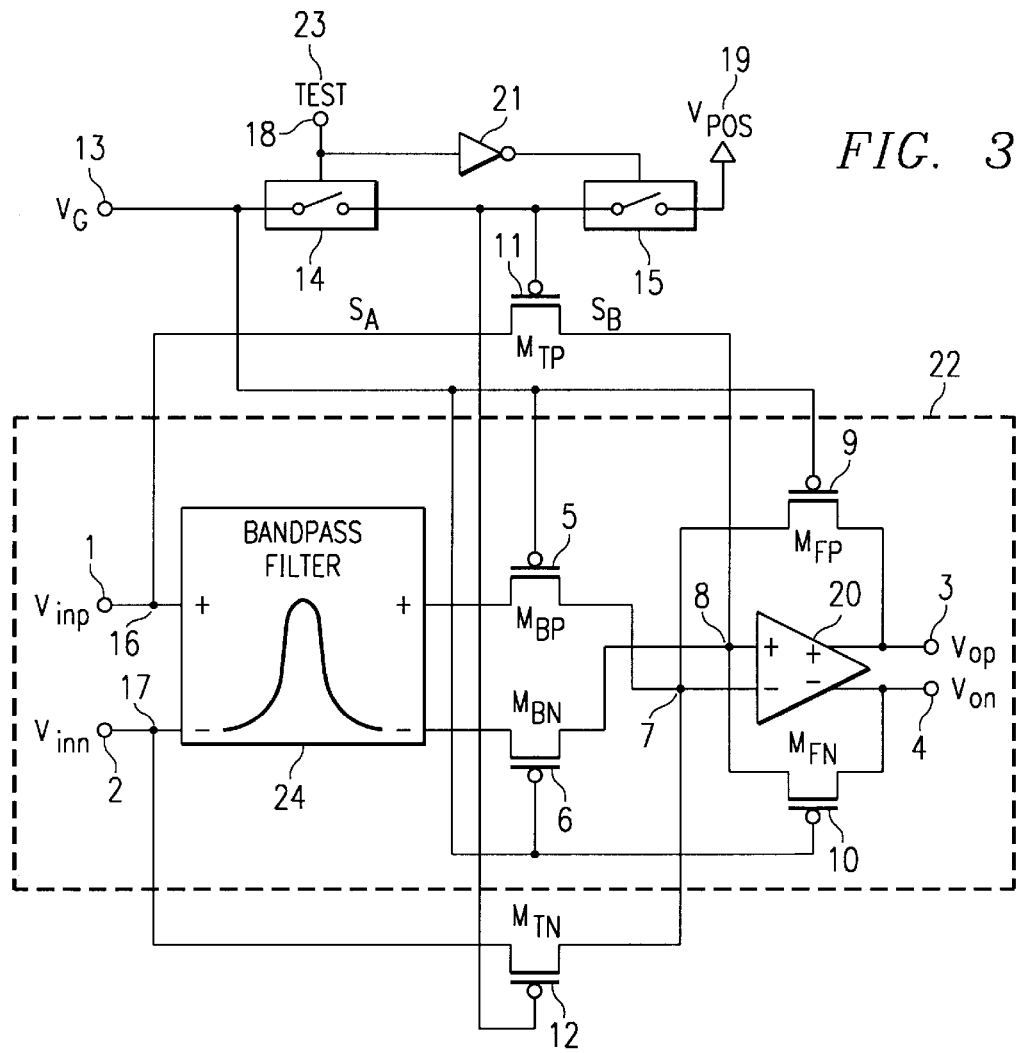
FIG. 3 illustrates an embodiment of a test circuit in accordance with the present invention.

As shown in FIG. 3, a test circuit according to the present invention comprises a bandpass filter circuit that includes at least two sub-circuits: a bandpass filter circuit 22; and a bandpass filter test circuit 23. In bandpass filter circuit 22, input signals $V_{inp}$, $V_{inn}$ are connected to terminals 1 and 2, respectively, and are fully differential input voltages. $V_{op}$, $V_{on}$ are fully differentiable output voltages produced by a bandpass filter 24, as amplified by subsequent circuit elements and outputted at terminals 3 and 4. Specifically, the differential output voltages produced by bandpass filter 24 are coupled to a pair of transistors 5 and 6 (designated $M_{BP}$ and $M_{BN}$, respectively). Transistors 5 and 6 are cross coupled to transistors 9 and 10 (designated $M_{FP}$ and $M_{FN}$, respectively) via circuit nodes 7 and 8. The differential output voltages provided by transistors 5 and 6 are coupled to operational amplifier 20, which has a gain of approximately 1000 in a presently preferred embodiment.

Test circuit 23 comprises transistors 11 and 12 (designated $M_{TP}$ and $M_{TN}$ respectively), and switches 14 and 15 with an inverter 21. Transistors 11 and 12 are connected to input voltages $V_{inp}$, $V_{inn}$ at nodes 16 and 17, respectively, and are cross coupled to transistors 10 and 9, respectively. Switches 14 and 15, which can be implemented as N-type MOSFET transistors, are connected to inverter 21 to ensure that switch 14 is deactivated when switch 15 is activated and vice versa. A TEST signal is applied to test circuit 23 at terminal 18. The TEST signal is responsible for selectively activating and deactivating test circuit 23 in a manner explained in further detail below. Switches 14 and 15 are connected in series between voltage levels $V_G$ (indicated by reference character 13) and $V_{POS}$ (indicated by numeral 19), both of which are constantly applied during operation. Voltage $V_G$ which is constantly applied at terminal 13, has a value less than the difference between an output common mode voltage ($V_o$) and the absolute value of the threshold voltage of the transistors of bandpass filter circuit 22. $V_{POS}$ has a value of 5 volts in a presently preferred embodiment.

The TEST signal is applied at terminal 18 in order to switch the circuit between a non-TEST mode and a TEST mode. The test signal, as discussed below, can be of either a HIGH or LOW value in order to achieve this change in operation. In non-TEST mode, the present invention operates as a bandpass filter in the usual fashion, and exhibits the magnitude characteristic shown in FIG. 2 with respect to the outputs at terminals 3 and 4. This results from the cross-coupling of transistors 5 and 6 ($M_{BP}$ and $M_{BN}$) with transistors 9 and 10 ($M_{FP}$ and $M_{FN}$) in non-TEST mode. In this mode, a TEST signal (e.g., a LOW signal) is applied at terminal 18 such that switches 14 and 15 are respectively, in open (nonconductive) and closed (conductive) states. These states cause the gates of transistors 11 and 12 to be connected to the highest possible supply voltage in the circuit, namely, $V_{POS}$.

To switch to TEST mode, an instantaneous bias voltage or TEST signal at a HIGH level—5 volts in a presently preferred embodiment—is applied at terminal 18. This signal changes switches 14 and 15, to their closed (conductive) and open (nonconductive) states, respectively, so that constantly applied voltage ($V_G$) at terminal 13 is connected to the gates of transistors 11 and 12.

Figure 4:
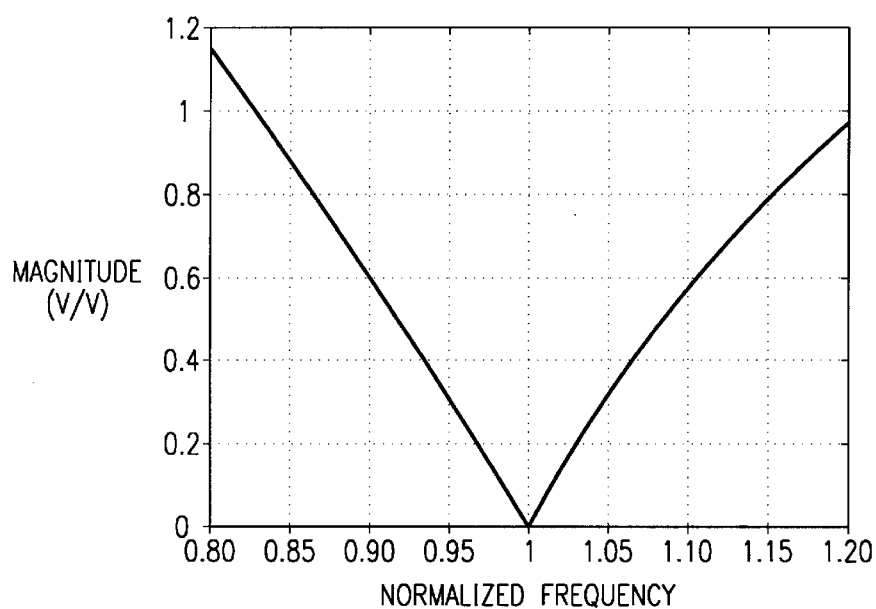
FIG. 4 illustrates a notchband characteristic generated by the circuit of FIG. 3 in test mode.

In TEST mode, when the HIGH level TEST signal is applied, transistors 11 and 12 ($M_{TP}$ and $M_{TN}$) operate transistors 5 and 6 ($M_{FP}$ and $M_{FN}$) to convert the magnitude characteristic of the bandpass filter output to a notchband magnitude characteristic by subtracting the bandpass filter output signal from its input signal. The effect of this conversion is shown in FIG. 4, which illustrates a notchband magnitude characteristic measured at the output of operational amplifier 20.

The presently preferred embodiment involves a bandpass filter with a gain of unity at its center frequency. The desired gain is achieved by choosing the ratio of the sizes of transistors 11/12 ($M_{TP}/M_{TN}$) which correspond to transistor channel width/length ratio $(W/L)_{TP,N}$, and the sizes of transistors 5/6 ($M_{BP}/M_{BN}$) which correspond to a ratio (W/L) $_{BP,N}$ according to the relationship: $(W/L)_{TP,N}=A_{BP} \times (W/L)_{BP,N}$ where $A_{BP}$ is the desired bandpass filter gain at the center frequency.

The input voltage/output voltage subtraction function of the TEST mode is verified by Kirchoff's current law equation for the currents coming into and leaving the input nodes of operational amplifier 20 in FIG. 3 as follows:

$$\left| \frac{V_{op}(s) - V_{on}(s)}{V_{ip}(s) - V_{in}(s)} \right| = \left| a_T \frac{G_T}{G_F} - \frac{G_B}{G_F} H_{BP}(s) \right|$$

where $V_{op}$, $V_{on}$ and $V_{ip}$, $V_{in}$, are the differential output voltage and input voltage pairs; s is the complex frequency variable; and $G_B$, $G_F$ and $G_T$ are the conductances of the P-type MOSFET transistors 11, 12, 5, 6, 9 and 10 (i.e., the pairs of transistors $M_{BP}$, $M_{BN}$, and $M_{FP}$, $M_{FN}$, and $M_{TP}$, $M_{FN}$, respectively). $a_T$ describes the switching in the test mode. That is, $a_T$ is 1 if in TEST mode and 0 in non-TEST mode, i.e., when the system is in a bandpass filter mode.

As can be seen from FIG. 4, the notchband magnitude characteristic has a very sharp minimum at the center frequency of the bandpass filter under test. This minimum is easier to identify than, for example, the maximum shown in FIG. 2 corresponding to the center frequency of the bandpass filter. In FIG. 2, a 1% precision corresponds to the detection of an 8 mV variance around a 1V maximum, whereas as shown in FIG. 4, the same precision corresponds to a detection of 60 mV around a minimum that is ideally 0V.

For optimal, fully differential operation when cross coupled, the transistor pairs 11/12 ($M_{TP}/M_{TN}$), and 5/6 ($M_{BP}/M_{BN}$) shown in FIG. 3 should be matched. Transistor pairs 11/12 ($M_{TP}/M_{TN}$) and 9/10 ($M_{FN}/M_{FP}$) should also be matched to yield a better minimum magnitude, corresponding to the center frequency of the bandpass filter under test.

Figure 5:
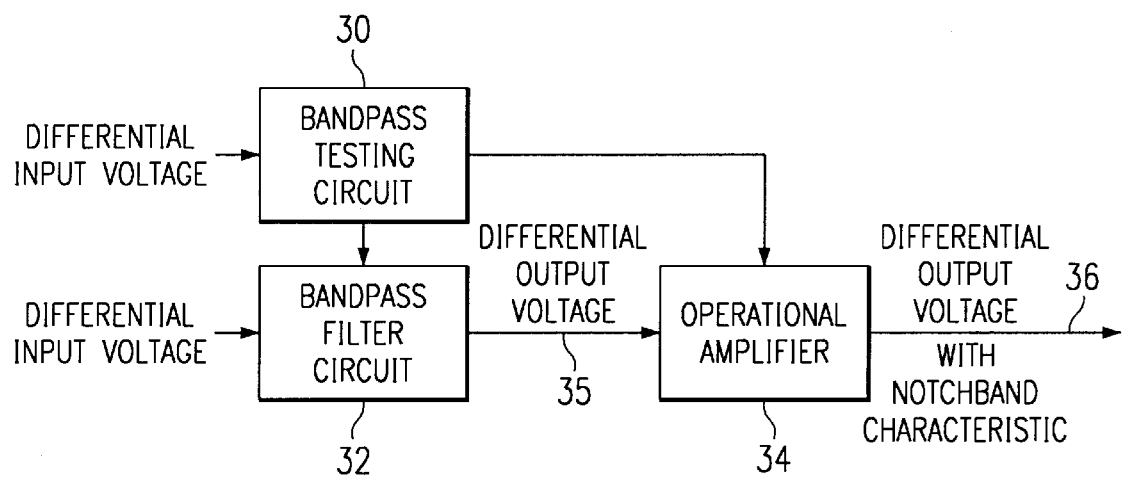
FIG. 5 is a flowchart illustrating the method of the present invention.

The method of testing a bandpass filter according to the present invention is depicted FIG. 5 The method allows the center frequency of a bandpass filter circuit 32 (such as that corresponding to filter 24 in FIG. 3) which receives a diffrerential input voltage and produces a differential output voltage 35, to be tested by coupling a test circuit 30 (such as that corresponding to test circuit 23 of FIG. 3) to bandpass filter circuit 32. The differential output voltage 35 is amplified by an operational amplifier 34 (such as that corresponding to operational amplifier 20 in FIG. 3). This operation generates a differential output voltage 36 that exhibits a notchband magnitude characteristic with a minimum magnitude corresponding to the center frequency of the bandpass filter. Thus, as has been shown, the method of the present invention, as shown in FIG. 5, exceeds the limitations of conventional methods and allows efficient and accurate determination of the center frequency of a bandpass filter.

Figure 6:
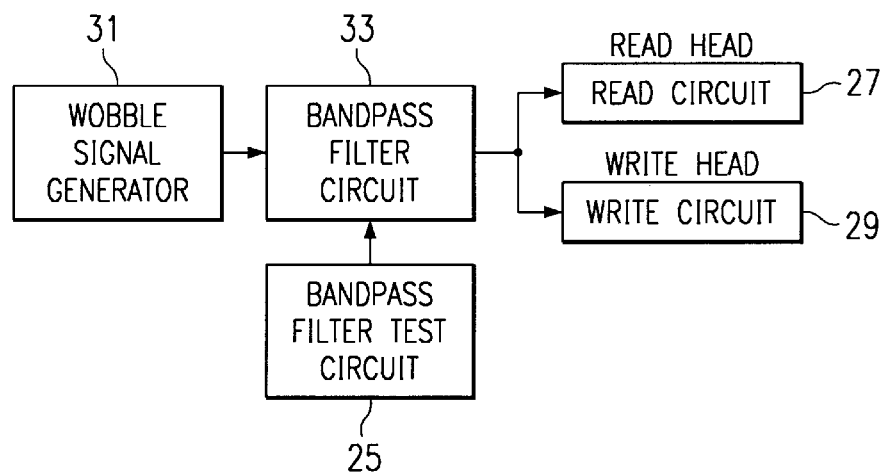
FIG. 6 is a block diagram illustrating an optical disk apparatus in accordance with the present invention.

As shown in FIG. 6, the present invention (denoted by elements 33 and 25 can be integrated into an optical storage or playback system such as a CD-RW or DVD-RAM device, comprising a wobble signal generator 31, read circuit 27 and write circuit 29. Various optical systems having read and write circuits 27 and 29, as well as wobble signal generator 31 and bandpass filter circuit 33, are already known and need not be explained in further detail for purposes of the present invention. An improvement in such an arrangement, particularly as to the bandpass filter being used therein, is also shown in my co-pending application identified above. The present invention further provides a circuit 25 to function in combination with these other structures so that accurate testing of bandpass filter characteristics—and, hence, optimal operation of the overall device—can be obtained. Measurement of the center frequency of the bandpass filter could be used, for example, to develop a signal that would achieve (whether manually or, through other firmware, automatically) adjustment of the bandpass filter characteristics so as to optimize detection of the wobble signal and overall performance of the device.

Bandpass filters are also used in apparatus other than optical disk devices. The present invention tests for the center frequency of a bandpass filter and can accordingly be extended to many other applications that use bandpass filters in their operation.

It will be apparent to those skilled in the art that various modifications and variations can be made in the bandpass filter test circuit of the present invention without departing from the spirit or the scope of the invention. Thus it is intended that that the present invention cover the modifications and variations of this invention provided they come within the scope of the appended claims and their equivalents.

What is claimed is:

1. A method for determining a center frequency of a bandpass filter comprising the steps:

applying a bias voltage to a test circuit operatively coupled to a bandpass filter circuit, said bandpass filter circuit receiving a differential input voltage and producing a differential output voltage, said test circuit modifying said differential output voltage to produce a modified differential voltage that exhibits a notchband magnitude characteristic; and identifying a minimum value of said modified differential output voltage exhibiting said notchband magnitude characteristic over a pre-determined range of frequencies including said center frequency, said minimum of said notchband characteristic corresponding to the center frequency of said bandpass filter.

2. The method of claim 1, wherein said bandpass filter has a gain of unity at the center frequency.

3. An apparatus for measuring the center frequency of a bandpass filter comprising:

a bandpass filter circuit, said bandpass filter circuit including a bandpass filter, which produces a differential output voltage when a differential input voltage is applied to said bandpass filter, and a first switching element coupled to said bandpass filter, said first switching element electrically coupled to said differential output voltage when a bias voltage is applied to said first switching element; and a testing circuit, said testing circuit including a second switching element, said second switching element being electrically coupled to said differential output voltage when said bias voltage is applied in response to a test signal to said second switching element, wherein said testing circuit converts a magnitude characteristic of said differential output voltage from a bandpass magnitude characteristic to a notchband magnitude characteristic.

4. The apparatus of claim 3 wherein said first switching element and said second switching element are transistors.

5. The apparatus of claim 3 wherein said second switching element comprises a first transistor and a second transistor, each comprising a channel, said first transistor and said second transistor having a first channel width characteristic and first channel length characteristic, said first switching element in said bandpass filter circuit comprises a third transistor and a fourth transistor, said third transistor and said fourth transistor having a second channel width characteristic and second channel length characteristic, a ratio of said first channel width characteristic and second channel length characteristic corresponding to a multiple of a gain of said center frequency of said bandpass filter.

6. The method of claim 5, wherein said first transistor and said second transistor are matched.

7. The apparatus of claim 5 wherein said third transistor and said fourth transistor are matched.

8. The apparatus of claim 3 wherein said test signal is one of LOW and HIGH levels.

9. The apparatus of claim 7, wherein said at least one switching element is connected to a maximum circuit supply voltage when said test signal is LOW.

10. The apparatus of claim 3 wherein said bandpass filter circuit further comprises an output amplification circuit.

11. The apparatus of claim 9 wherein said output amplification circuit comprises a third switching element and an operational amplifier.

12. The apparatus of claim 10 wherein said third switching element comprises a fifth transistor and a sixth transistor.

13. The apparatus of claim 11 wherein said fifth transistor and said sixth transistor are matched.

14. The apparatus of claim 11 wherein said transistors are P-type MOSFET transistors.

* * * * *